US007223674B2

(12) United States Patent
Baluswamy et al.

(10) Patent No.: US 7,223,674 B2
(45) Date of Patent: May 29, 2007

(54) METHODS FOR FORMING BACKSIDE ALIGNMENT MARKERS USEABLE IN SEMICONDUCTOR LITHOGRAPHY

(75) Inventors: Pary Baluswamy, Boise, ID (US); Peter Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 10/840,733

(22) Filed: May 6, 2004

(65) Prior Publication Data

US 2005/0250292 A1    Nov. 10, 2005

(51) Int. Cl.
*H01L 21/301* (2006.01)
(52) U.S. Cl. ...................... 438/462; 438/690
(58) Field of Classification Search ............... 438/401, 438/462, 690, 942
See application file for complete search history.

(56) References Cited

U.S. PATENT DOCUMENTS

| 5,284,792 | A * | 2/1994 | Forster et al. ................ 438/29 |
| 5,843,831 | A * | 12/1998 | Chung et al. ............... 438/401 |
| 5,908,719 | A * | 6/1999 | Guckel et al. ................ 430/5 |
| 6,441,504 | B1 * | 8/2002 | Glenn et al. ................ 257/797 |
| 6,617,702 | B2 * | 9/2003 | Hsu et al. .................. 257/797 |
| 2002/0170891 | A1 * | 11/2002 | Boyle et al. ........... 219/121.67 |
| 2003/0150384 | A1 * | 8/2003 | Baude et al. ............... 118/721 |
| 2003/0155328 | A1 * | 8/2003 | Huth et al. .................... 216/65 |
| 2004/0219444 | A1 * | 11/2004 | Shibata et al. ................ 430/30 |
| 2005/0202651 | A1 * | 9/2005 | Akram ...................... 438/463 |

OTHER PUBLICATIONS http://www.mesofab.com (publication date unknown).
http://www.me.mtu.edu/~microweb/GRAPH/Laser/SPECMET.JPG (publication date unknown).
http://www.potomac-laser.com/products/pl1500aframe.html (publication date unknown).
http://www.me.mtu.edu/~microweb/chap4/ch4-2.htm (publication date unknown).
http://www.me.mtu.edu/~microweb/GRAPH/Laser/FLUENCE.JPG (publication date unknown).

(Continued)

*Primary Examiner*—Hsien-Ming Lee
(74) *Attorney, Agent, or Firm*—Wong, Cabello, Lutsch, Rutherford and Brucculeri, L.L.P.

(57) ABSTRACT

Disclosed herein are methods for forming photolithography alignment markers on the back side of a substrate, such as a crystalline silicon substrate used in the manufacture of semiconductor integrated circuits. According to the disclosed techniques, laser radiation is used to remove the material (e.g., silicon) from the back side of a substrate to form the back side alignment markers at specified areas. Such removal can comprise the use of laser ablation or laser-assisted etching. The substrate is placed on a motor-controlled substrate holding mechanism in a laser removal chamber, and the areas are automatically moved underneath the laser radiation to removal the material. The substrate holding mechanism can comprise a standard chuck (in which case use of a protective layer on the front side of the substrate is preferred), or a substrate clamping assembly which suspends the substrate at its edges (in which case the protective layer is not necessary). Alternatively, a stencil having holes corresponding to the shape of the back side alignment markers can be placed over the back side of the substrate to mitigate the need to move the substrate to the areas with precision.

69 Claims, 10 Drawing Sheets

OTHER PUBLICATIONS http://www.xsil.com/products/index.htm (publication date unknown).

http://www.analogmultimedia.de/Himt/uploads/Download/LAM66_s.pdf (publication date unknown).

Thin Film Processes II, (ed. John L. Vossen & Werner Kern), pp. 621-670, 749-856 (Academic Press 1991).

http://www.minanet.com/documents/ASML.pdf (Sep. 25, 2003).

* cited by examiner

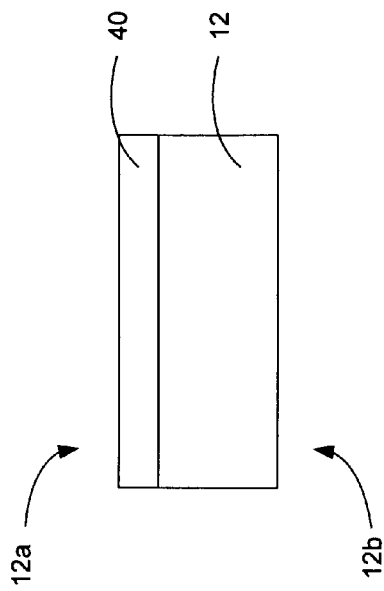
Figure 3A (prior art)
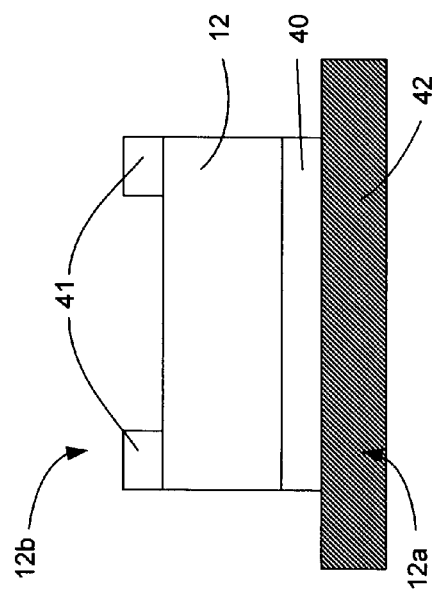
Figure 3B (prior art)
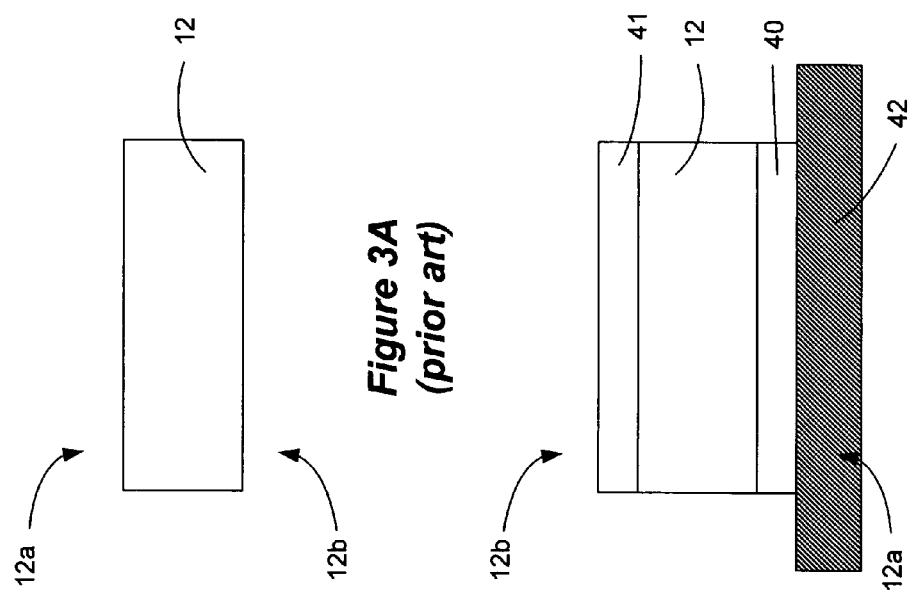
Figure 3C (prior art)
Figure 3D (prior art)

METHODS FOR FORMING BACKSIDE ALIGNMENT MARKERS USEABLE IN SEMICONDUCTOR LITHOGRAPHY

CROSS REFERENCE TO RELATED APPLICATIONS

This application is related to U.S. Pat. application Ser. No. 10/840,324, which is filed concurrently herewith, and which is incorporated by reference in its entirety.

FIELD OF THE INVENTION

Embodiments of this invention relate to improved methods for forming back side alignment markers useable in semiconductor photolithography.

BACKGROUND

When fabricating an integrated circuit, and as is well known, a series of layers are deposited on a substrate (usually a crystalline silicon substrate) and are patterned and etched to form a circuit. For the circuit to work properly, it is important that each subsequent layer be aligned with the previously formed layer or layers, at least within some permissible tolerance.

To align the various layers, and referring to FIG. 1A, a substrate 12 having a photoresist applied thereon (not shown) is placed in a photolithographic chamber 10, sometimes referred to as a "stepper" or "scanner." In the stepper 10, a mask or reticle 27 is used to pattern the photoresist. As the patterned photoresist ultimately dictates the positioning of the underlying circuit layer to be etched, its alignment is critical.

To bring the substrate 12 into alignment with the mask 27, an image of some structure on the mask and some structure 24 on the wafer are compared using well-known optical analysis equipment 14, with such images being received by optical sensors 20. If alignment is needed, the optical analysis equipment 14 can control the positioning of a chuck 16 on which the substrate 12 sits via motor stages 18, which, for example, can move the chuck 16 along the X-axis, Y-axis, or rotational θ-axis as appropriate. Such alignment is usually assessed at numerous locations around the substrate 12's perimeter, which accordingly requires reference to a plurality of alignment structures 24 on the substrate 12, as shown in FIG. 1B. However, reference to a single alignment marker could also be used.

Although alignment structures 24 can constitute an actual active portion of the circuit being fabricated, a dedicated inactive structure is usually formed for this purpose—what is referred to as an alignment marker. Referring to FIG. 1B, such alignment markers 24 are typically formed outside of the active integrated circuit area 22 on the wafer, i.e., in the area in which the substrate will be scribed or "diced" for later insertion into packages. A simple "cross" pattern is illustrated for the alignment marker 24, but as one skilled in the art will understand, such markers can come in a variety of different shapes and sizes (e.g., chevrons, gratings, squares, etc.), depending on the alignment task be performed. Typically, more than one alignment marker 24 is fabricated on the substrate 12 as shown, which may range from approximately 20 to 500 microns in size.

However, alignment markers appearing on the side of the substrate from the problem that such markers may eventually become coverd with opaque materials during later processing steps, and hence may become difficult for the opitcal sensors 20 to "see," as discussed at length in above-incorporated U.S. patent application Ser. No. 10/840,324.

Accordingly, the prior art has experimented with the use of back side alignment markers. As their name suggests, back side alignment markers are located on the opposite side of the substrate from the front side where the active circuitry is formed. The processing steps used to form the active circuitry on the front side generally do not appreciably affect the back side; for example, materials deposited on the front side of the substrate will generally not find their way to the back side, except in trace amounts. Accordingly, back side alignment markers generally remain unaffected during processing of the substrate, and therefore remain visible to the optical sensors 20 for alignment purposes.

An exemplary stepper chamber 30 relying on the use of back side alignment markers 27 is shown in FIG. 2. Such a chamber is generally similar to the chamber 10 of FIG. 1, but includes holes 17 in the bottom of the chuck 16 aligned with the backside alignment markers 27. Mirrors 15 direct light between the back side alignment markers 27 and the optical sensors 20 to allow the alignment markers 27 to be "seen" for alignment purposes. Alternatively, channels through the chuck and parallel to the substrate 12's surface can carry the optical path between the back side alignment markers 27 and the optical sensors 20, such as is disclosed in http://www-.minanet.com/documents/ASML.pdf (Sep. 25, 2003), which is submitted herewith and which is incorporated by reference in its entirety.

However, back side alignment markers still suffer from processing difficulties, as illustrated by the process of FIG. 3, which shows how such back side alignment markers are traditionally formed. FIG. 3A shows in cross section a blank or stating substrate 12, which again is usually a silicon crystalline substrate. The substrate 12 has a front side 12a and a bottom side 12b. Prior to fabrication of the integrated circuit on the front side 12a, the front side is highly polished, rendering the front side 12a to near perfect smoothness at the atomic level that is appropriate for the formation of transistors and the like. The back side 12b is generally also smooth, but usually not as smooth as the front side 12a.

Traditionally, the back side alignment markers 27 are formed using traditional photolithography techniques. However, care must be taken to protect the near-perfectly smooth front side 12a, as this surface is easily scratched. If scratched, the electrical structures (such as transistors) eventually formed at the front side 12a will "leak" current and otherwise may perform poorly from an electrical standpoint. Accordingly, before formation of the back side alignment markers 27, a protective layer 40 is formed on the front side 12a, as shown in FIG. 3B. Typically, this protective layer 40 constitutes a silicon dioxide or silicon nitride layer.

With the front side 12a protected, photolithography processing on the back side 12b can now begin. Accordingly, and referring to FIG. 3C, the substrate 12 is inverted and placed front side 12a down onto a work surface 42, which varies throughout the back side alignment marker formation process but which initially would comprise a photoresist spinning apparatus. A photoresist 41 is deposited (spun) on the back side 12b, and is moved to a stepper apparatus, where it is exposed using a mask having the desired back side alignment marker 27 pattern (not shown) and developed to expose the back side 12b through the photoresist (FIG. 3D). The substrate 12 is then moved to an etching chamber (not shown) where the alignment marker is etched into the back side 12b using the remaining photoresist as a masking layer (FIG. 3E). Thereafter, the remaining photoresist 41 is stripped (not shown), and the protective layer 40 is etched away (not shown), thus leaving the back side alignment marker 27 on the back side 12b of the substrate 12 (FIGS. 3F and 3G). Thereafter, the substrate 12 can be processed to form an integrated circuit, using the back side alignment marker 27 (or markers) to align the substrate 12 with each mask during sensitive photolithography steps in chamber 30 (FIG. 2).

However, it should be appreciated from the foregoing that formation of the back side alignment markers 27 involves a lot of preparation—protective layer formation, photoresist deposition, patterning and removal, etching, removal of these layers, etc.—before processing of the substrate 12 can begin in earnest to form active useful structures on the front side 12a. Accordingly, the art would be benefited by improved methods for forming back side alignment markers, and in particular methods that forego these additional steps. This disclosure provides solutions.

SUMMARY

Disclosed herein are methods for forming photolithography alignment markers on the back side of a substrate, such as a crystalline silicon substrate used in the manufacture of semiconductor integrated circuits. According to the disclosed techniques, laser radiation is used to remove the material (e.g., silicon) from the back side of a substrate to form the back side alignment markers at specified areas. Such removal can comprise the use of laser ablation or laser-assisted etching. The substrate is placed on a motor-controlled substrate holding mechanism in a laser removal chamber, and the areas are automatically moved underneath the laser radiation to removal the material. The substrate holding mechanism can comprise a standard chuck (in which case use of a protective layer on the front side of the substrate is preferred), or a substrate clamping assembly which suspends the substrate at its edges (in which case the protective layer is not necessary). Alternatively, a stencil having holes corresponding to the shape of the back side alignment markers can be placed over the back side of the substrate to mitigate the need to move the substrate to the areas with precision. Using the disclosed techniques, a separate photolithography step to form the back side alignment markers is not necessary, and additionally the need to use a protective layer on the front side of the substrate is potentially unnecessary, saving time and cost, and reducing potential sources of contamination.

BRIEF DESCRIPTION OF THE DRAWINGS

Embodiments of the inventive aspects of this disclosure will be best understood with reference to the following detailed description, when read in conjunction with the accompanying drawings, in which:

FIGS. 3A–3G illustrate a prior art process for forming back side alignment markers using photolithography and a protective layer for the front side of the substrate.

DETAILED DESCRIPTION

In one embodiment of the disclosed invention, laser-assisted etching or laser ablation is used to form back side alignment markers. The disclosed technique is beneficial over the prior art in that it does not require the use of photolithography to form the back side alignment markers, and additionally in some embodiments does not require the provision of a protective layer on the front side of the substrate. It should be noted that both laser-assisted etching and laser ablation are well-known techniques that have been used to etch materials on integrated circuits. Accordingly, only basic aspects of these techniques are discussed, with the focus of the discussion centering on aspects relevant to the back side alignment marker issues discussed earlier.

Figure 4:
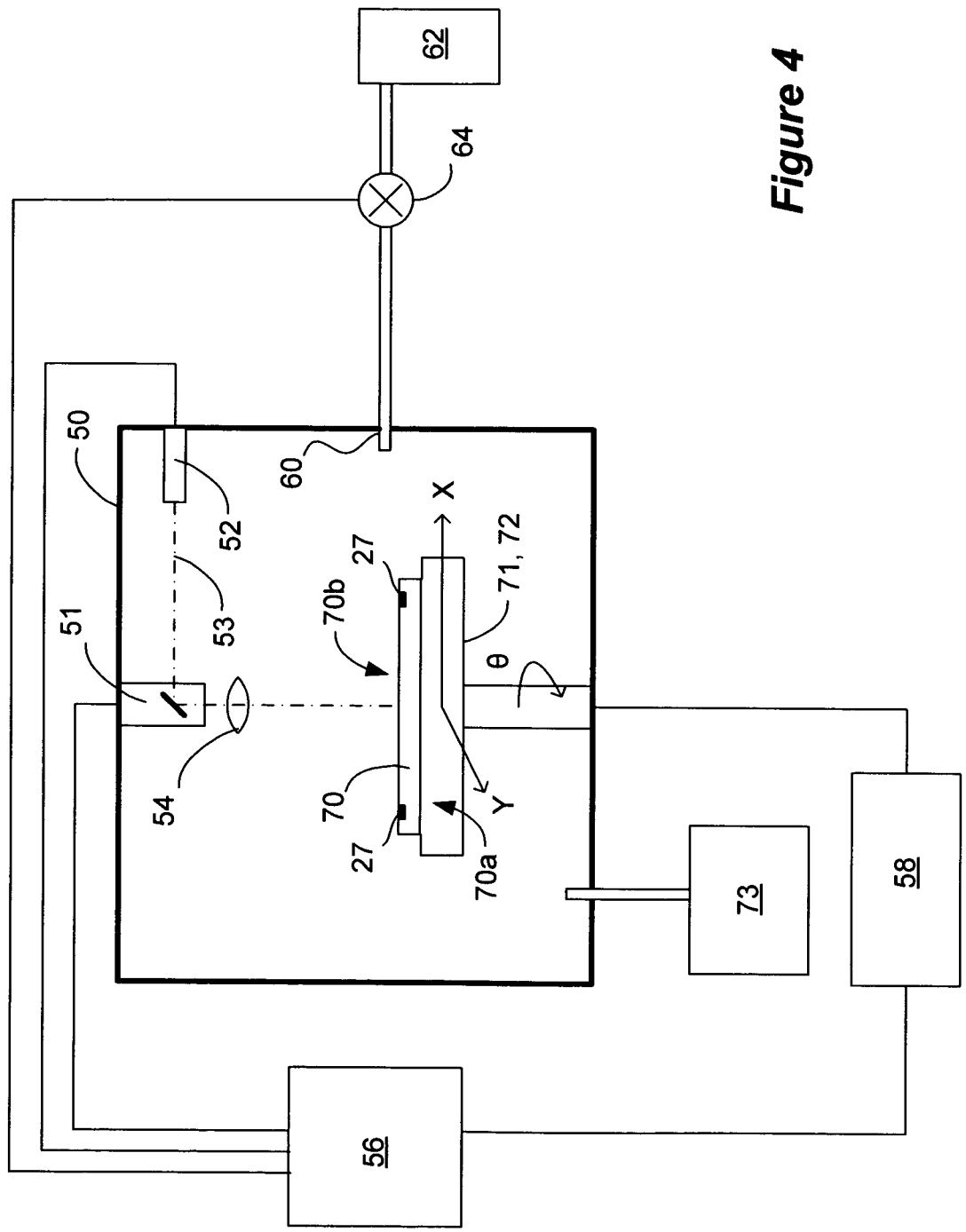
FIG. 4 illustrates a prior art laser ablation or laser-assisted etch chamber useful in accordance with the disclosed technique for forming back side alignment markers without the need for a photolithography step.

In FIG. 4, a laser-assisted etch/laser ablation chamber 50 is shown, and which is used in this embodiment to form the back side alignment markers. The chamber 50 includes an optical sensor 51, a laser 52, a lens or lenses 54, a computer 56, motor stages 58, a gas inlet port 60 coupled to an etchant gas source 62 via a valve 64, and a purge pump 73. Chambers with these components are well known, and will vary in design depending on whether laser-assisted etching or laser ablation techniques are used. Because a gas inlet port 60, an etchant gas source 62, and a purge pump 73 are shown, chamber 50 as illustrated more accurately represents a laser assisted-etching chamber. Were laser ablation to be used for the application in question, such gas- and etching-specific structures may not be necessary. Further details concerning laser-assisted etch/laser ablation chambers 50 are described in above-incorporated U.S. patent application Ser. No. 10/840,424, Also present is the substrate 70 to be processed, which sits upon a substrate holding mechanism 71, such as a chuck 72 or a damp assembly 79 Ia be described in further debit later.

The laser 52 is used to etch or ablate the bulk substrate 70 material on the backside 70b without the need to practice the photolithography steps of the prior art (photoresist deposition, exposure, cleaning and removal of the photoresist, etc.). In this regard, the substrate 70 is initially aligned front side 70a down in the chamber 50. This alignment can be relatively crude (e.g.,+/−20 microns), and need not be as sophisticated as the alignment schemes used to align the circuit layers in the device. Thus, initial alignment need only be 30 /−5 microns for example, and can be performed manually, via operator visual inspection through a microscope, or by automated optical detection schemes, such as automated detection of the edges of the substrate 70 via the use of the optical sensor 51.

Figure 5B:
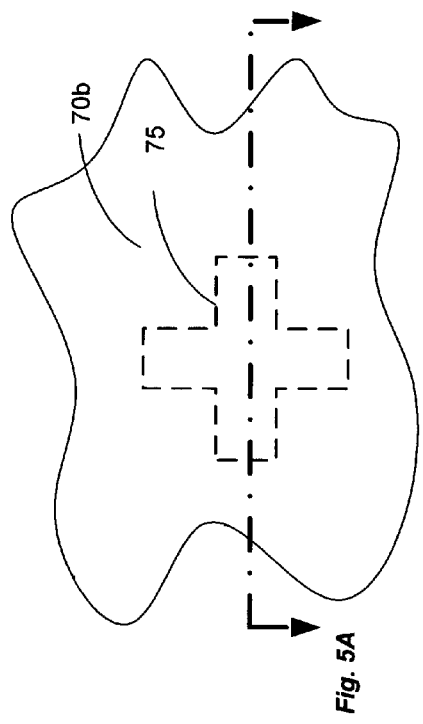
FIGS. 5A–5D illustrate using cross-sectional views the disclosed technique for forming back side alignment markers without the need for a photolithography step.
Figure 5D:
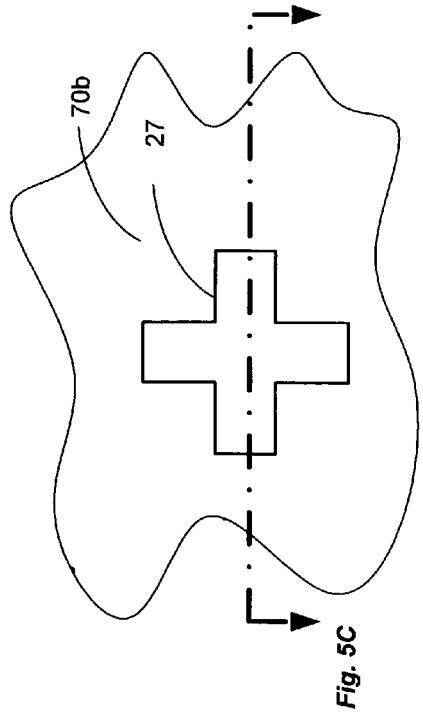
Figure 5A:
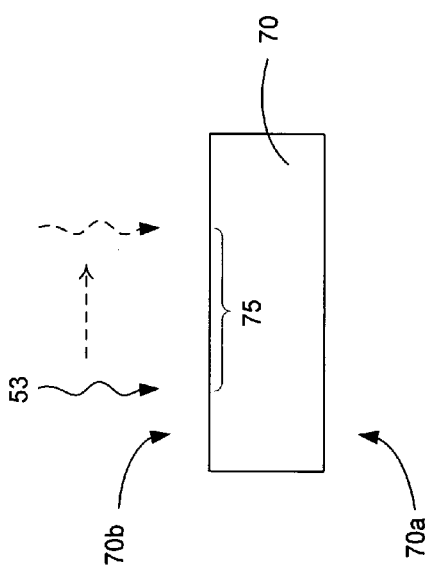
Figure 5C:
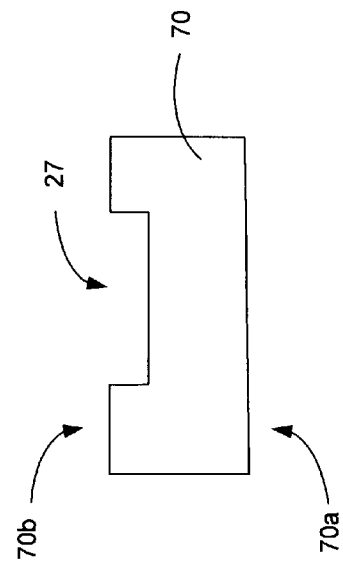

Once aligned, computer 56 executes a program specific for the substrate 70 in question, and armed with knowledge of the X, Y coordinates of where the back side alignment markers 27 are to be fabricated on the substrate 70. Accordingly, the computer 56, moving the substrate holding mechanism 72 via motor stages 58, brings the desired back side alignment marker areas 75 into alignment (FIGS. 5A and 5B) and engages the laser 52 to form laser radiation 53 to etch or ablate the back side 70b of the substrate 70, e.g., of crystalline silicon (FIGS. 5C and 5D). Thereafter, the substrate 70 can be cleaned if necessary, and as it would be cleaned in any event prior to further processing of active structures on the front side 70a of the substrate 70. In short, the back side alignment markers 27 are formed without photolithography and all of the steps entailed therein.

As noted earlier, techniques for using laser-assisted etching and laser ablatement of materials on semiconductor substrates are well known, and hence are not reiterated in much detail herein. Considerations relevant to such selective area processing can be found in Thin Film Processes II, (ed. John L. Vossen & Werner Kern), pp. 621–670, 749–856 (Academic Press 1991), which is submitted herewith and which is incorporated herein by reference.

Laser ablation is preferably accomplished using an exciner, YAG, or ND-YAG laser which essentially vaporizes the material where it is focused. Suitable ND-YAG lasers have wavelengths of 355 nm, and suitable excinier lasers have wavelengths of 193 nm or 248 nm. Power levels for such lasers are typically in the 1-Watt range. Laser ablation is simpler to implement, and will remove material relatively quickly, but is more difficult to control. Moreover, the vaporized material may need to be cleaned from the substrate 70's surface. This being said however, laser ablatement can be a suitable choice for forming back side alignment markers in the substrate 70 in some applications. Exemplary excimer lasers include the PL-1500A Excimer Laser manufactured by Potomac Photonics, Inc., and the xsie200 Excimer Laser manufactured by Xsil LtcL An exemplary YAG laser suitable for ablation comprises that LAM 66 manufactured by Heidelberg Instruments Mikrotecbnik GmbT-J. Further details regarding considerations for laser ablation can be found at http://www.me.mtu.edu/~microweb/chap4/ch4–2.htm, http://www.me.mtu.edu/~microweb/graph/laser/fluence.jpg, and http://www-.me.mtwedu/~microweb/graphl/laser/specmet.jpg, which are submitted herewith and which are incorpated by reference in their entireties.

Laser-assisted etching, by contrast, is slower, but better controlled, and hence is preferred for the application in question. In laser-assisted etching, an etchant gas is introduced into the chamber 50 from an etchant gas source 62 through valve 64 and gas inlet port 60. The etchant gas is preferably introduced into the chamber 50 as shown proximate to and parallel with the substrate 70's surface. Interaction of the laser light and the etchant gas produces a controlled reaction at the surface of the substrate 70 to remove the material in question. Of course, the etchant gas to be used for a particular application, as well as the laser 52 parameters (wavelength; power; spot size) will depend on the composition of the substrate 70, but again such laser-assisted processes are well known. If silicon or polysilicon is being etched, $SF_6$ would be a suitable etchant gas and would be used in conjunction with a laser having approximately a 10 um wavelength. Other etchant gases and associated laser wavelengths suitable for etching silicon can be found in the above-referenced Thin Film Processes book incorporated above at page 832. An exemplary laser-assist etch chamber 50 can comprise the laser etch and deposition chamber published at http://www.mesofab.com, which is submitted herewith and which is incorporated herein by reference.

Because the area 75 in which material will be removed will generally be relatively large compared to the spot size of the laser 52, removal will preferably be accomplished by rastering the area 75 underneath the laser 52. The laser 52 can either run continuously, or can be turned on and off at each rastered location. Alternatively, if the laser spot size is large enough and comparable with the size of area 75, rastering may not be necessary.

Figure 3E:
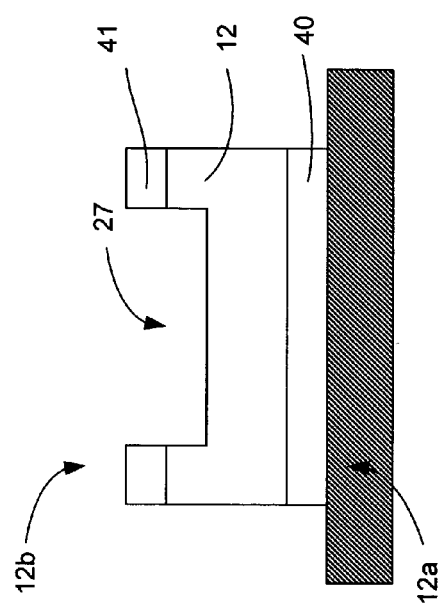
Figure 3F:
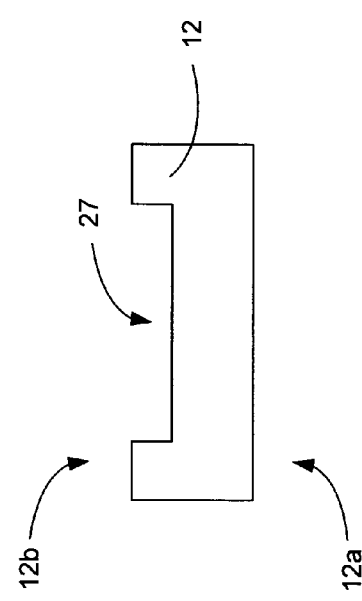
Figure 3G:
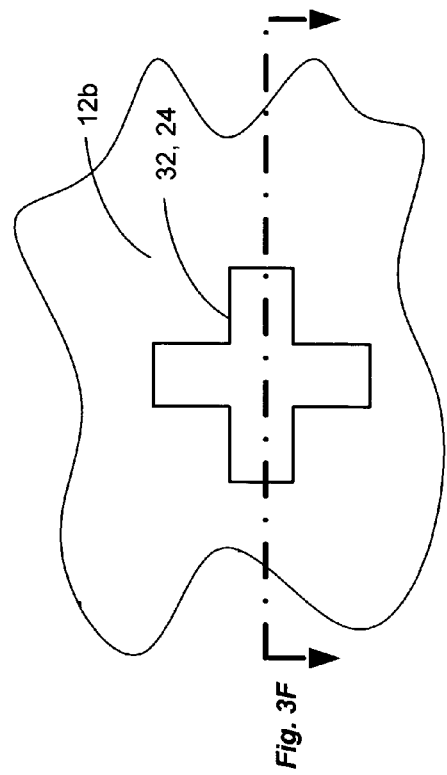

As noted earlier, it is important during formation of the back side alignment markers 27 that the front side 70a of the substrate 70 not be damaged. In the prior art, protection of the front side 70a surface was provided by a protective layer (40; FIG. 3B). Using the laser-assisted etch/laser ablation chamber 50 shown in FIG. 4, provision of such a protective layer would be preferred, as the front side 70a of the wafer comes into contact with the chuck 72.

Figure 6:
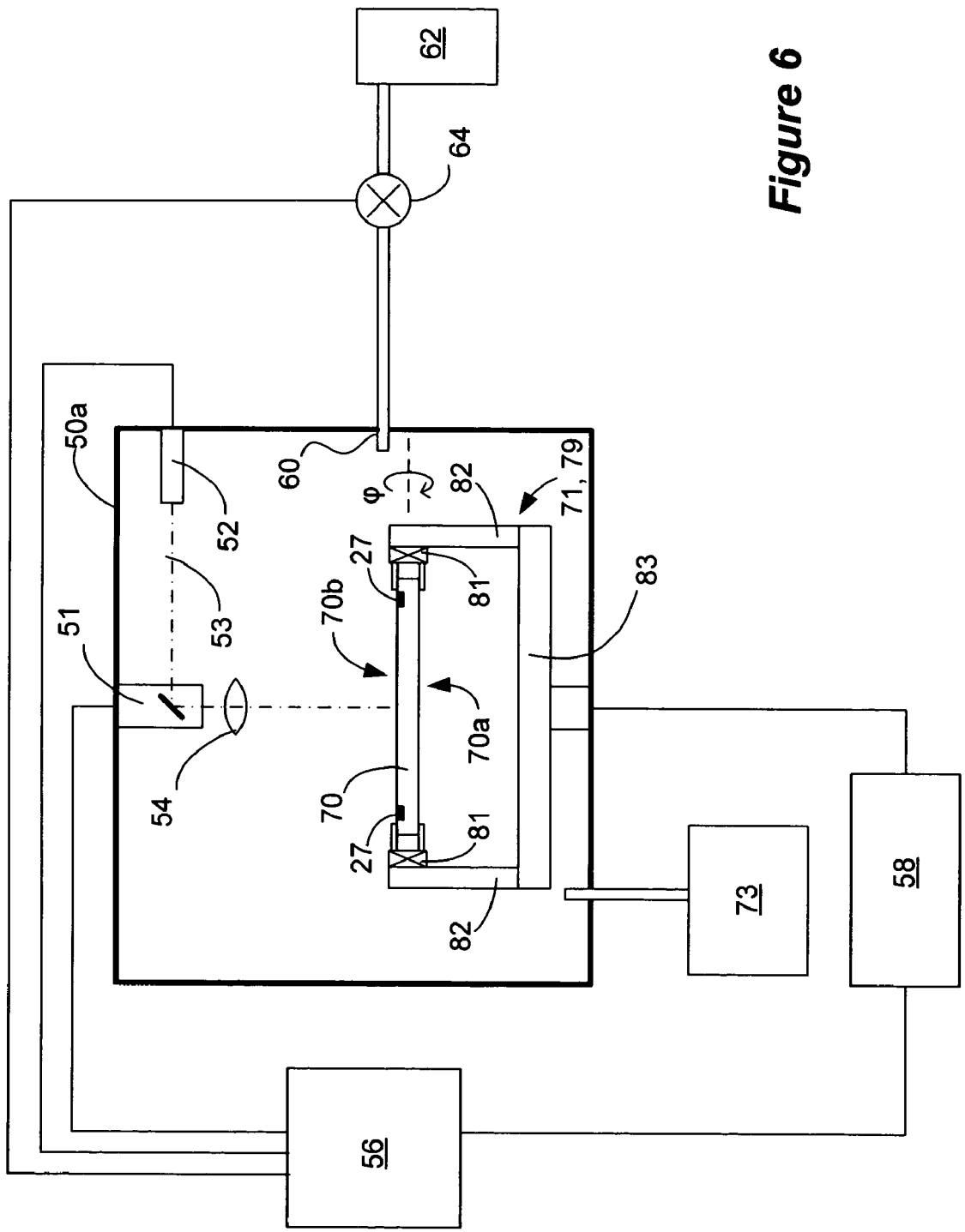
FIG. 6 illustrates a modified laser ablation or laser-assisted etch chamber having a clamping assembly for suspending the substrate, thus mitigating the need to provide a protective layer on the front side of the substrate.
Figure 7:
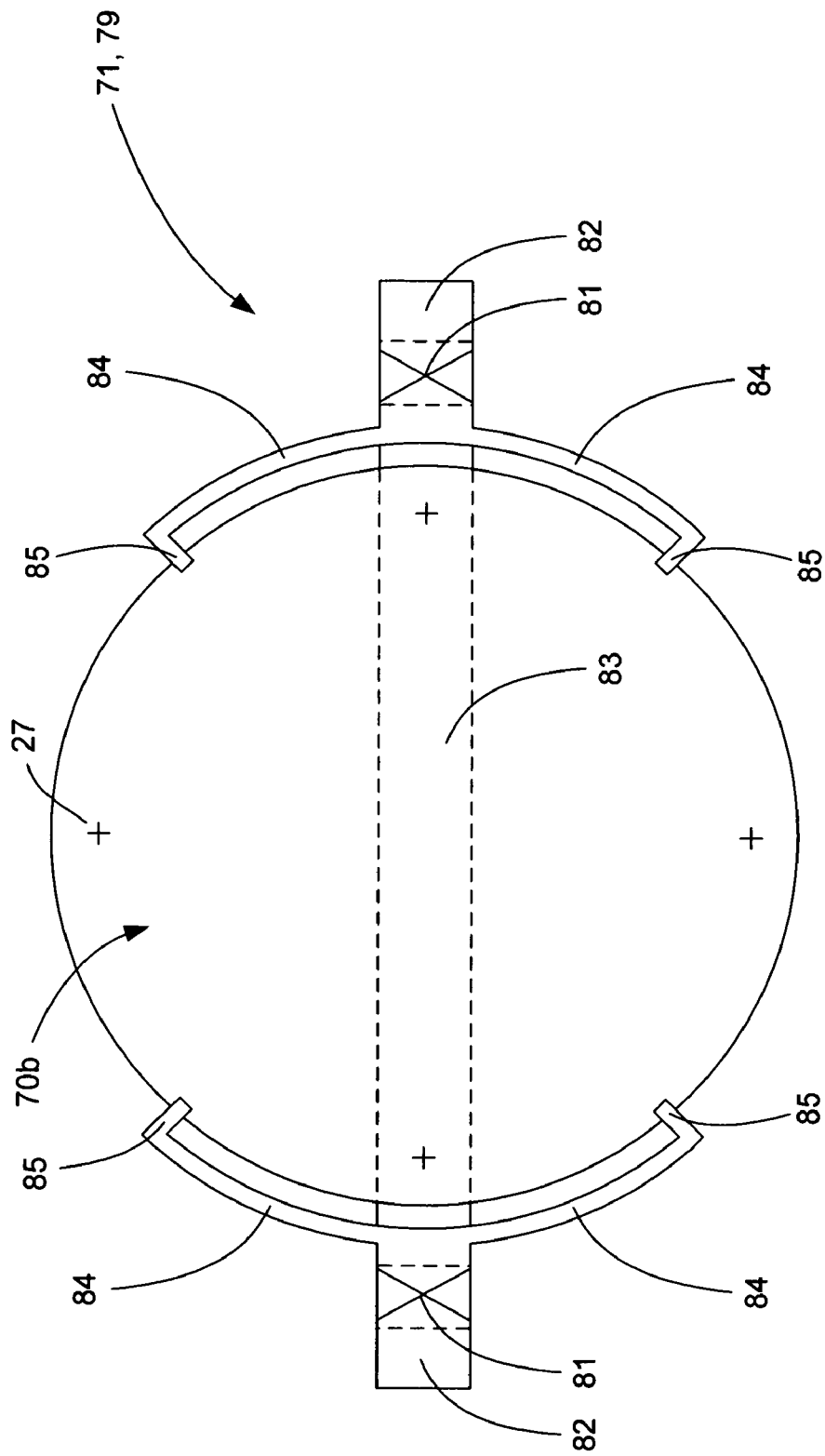
FIG. 7 illustrates a top down view of the clamping assembly of FIG. 6.

However, in a preferred embodiment, provision of a front side 70a protective surface is rendered unnecessary by making modifications to the laser-assisted etch/laser ablation chamber 50. Specifically, and as shown in FIGS. 6 and 7, the chamber 50a has been modified by exchanging a clamp assembly 79 for the chuck 72 of FIG. 4. The clamp assembly 79 has the same translational capabilities as the chuck 72, and again is controlled in its movement by the computer 56 via motor stages 58. However, through the use of the clamp assembly 79, the substrate 70 is suspended within the modified chamber 50a such that its front side 70a does not come into contact with the clamp assembly and does not substantially come into contact with any work surface, except at certain non-critical points 85 along its edge not otherwise suitable for the formation of active circuitry. Accordingly, the back side alignment markers 27 can be fabricated in modified chamber 50a without the need to provide a protective layer 40 on the front side 70a. This save a process step, and allows for processing of active structures on the substrate 70 essentially immediately after the back side alignment markers 27 are formed.

As best shown in FIG. 7, the clamp assembly 79 spans underneath the substrate 70 at cross member 83 and rises along toward the sides of the substrate at risers 82. Clamp arms 84 are coupled to the risers 82 and contain a bottom arms and top arms, which contact the front side 70a and back side 70b of the substrate 70 respectively. The clamp arms 84 are coupled to the risers 82 via suitable mechanisms 81. These mechanisms 81 could comprise the spring mechanism for biasing the top and bottom clamp arms 84 together to pin the substrate 70 therebetween, and additionally can incorporate motors to allow the substrate 70 to be rotated around an axis (φ) joining the two mechanisms 81. This allows the wafers to be loaded front side 70a up, and then rotated to bring the back side 70b up, thus providing operational flexibility. Rotational capability also allows for front side laser-based processing as well, e.g., to form alignment markers on the front side 70a as well as the back side 70b. Such rotation and activation of the motors can be accomplished using the computer 56 and the motor stage controls 58, with wiring to the motors 81 being routed though the body of the cross member 83 and the risers 82.

Figure 1A:
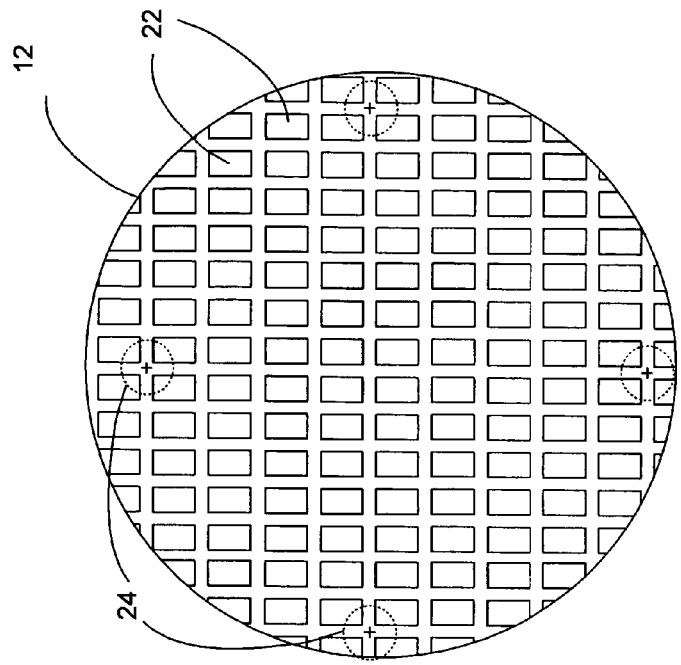
FIG. 1A illustrates a prior art photolithographic stepper for optically sensing front side alignment markers on a substrate.
Figure 1B:
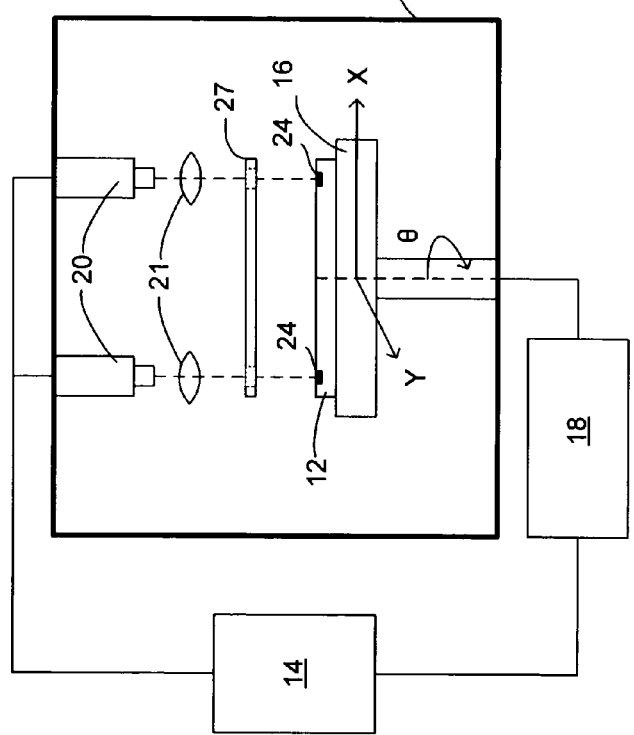
FIG. 1B illustrates a top-down view of the alignment markers on the substrate.
Figure 2:
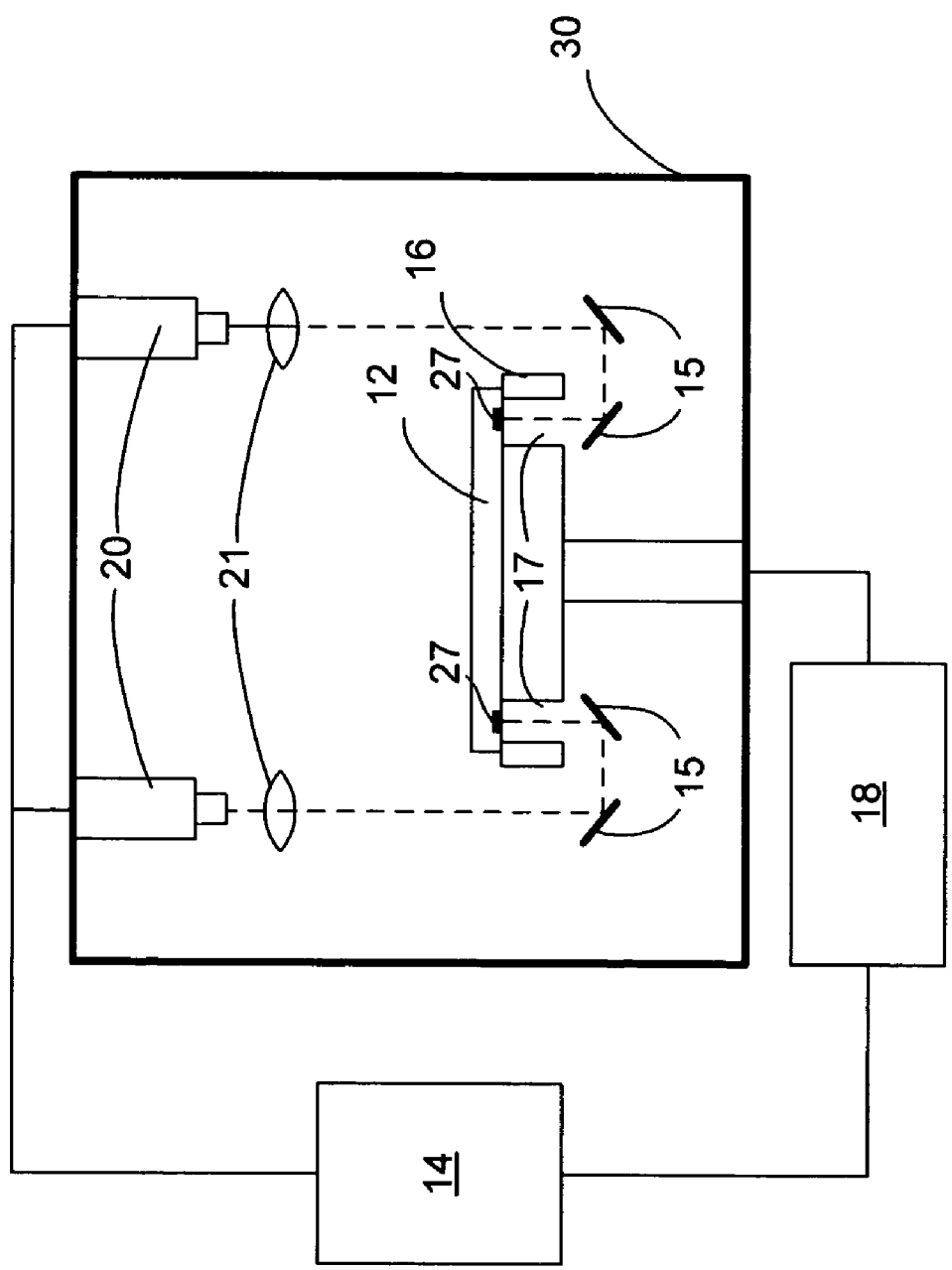
FIG. 2 illustrates a prior art photolithographic stepper for optically sensing back side alignment markers on a substrate.
Figure 9:
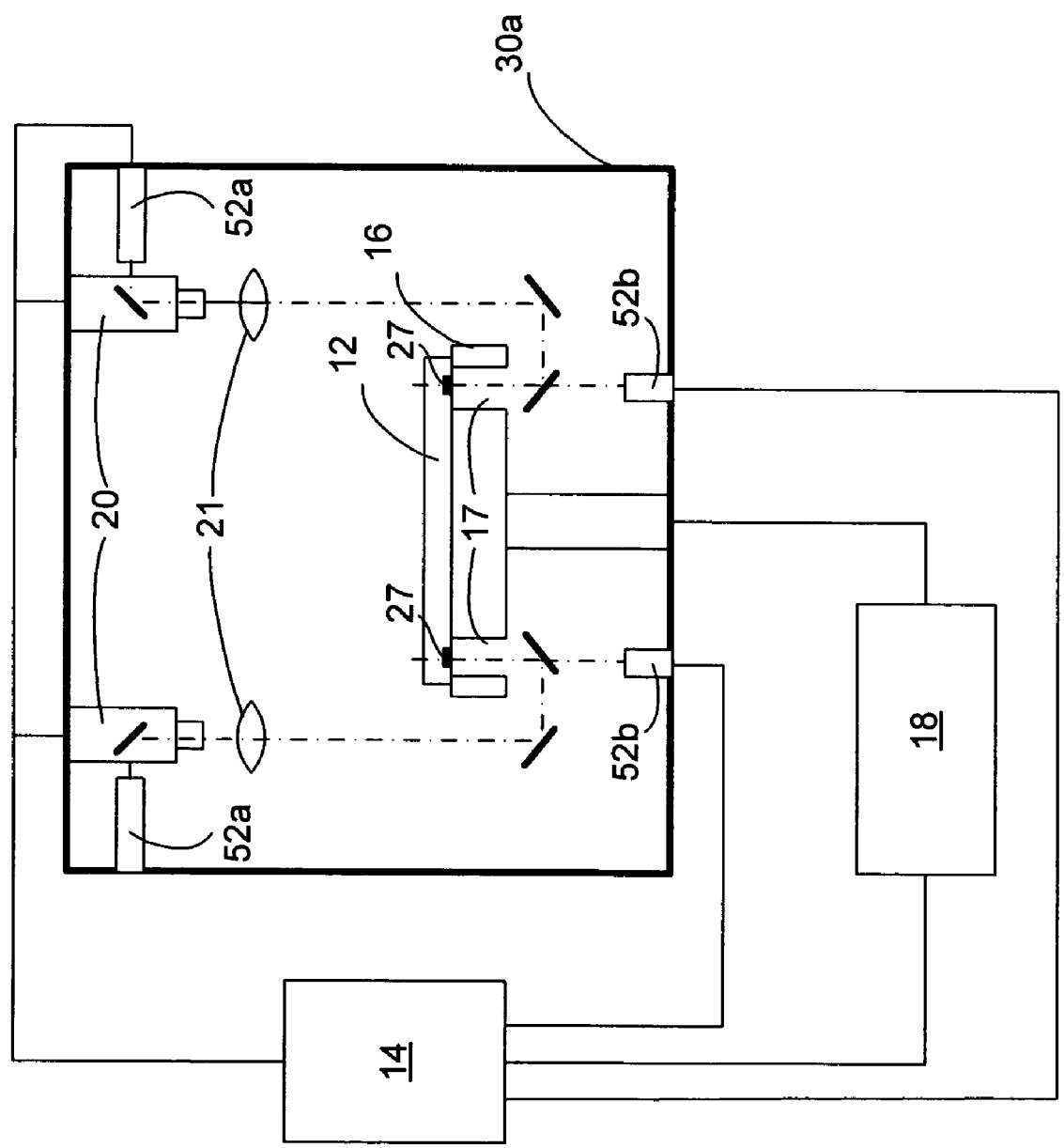
FIG. 9 illustrates a back side alignment stepper which has been modified to include lasers for writing the back side alignment markers.

In other embodiments, the substrate 70 need not be flipped as in chamber 50a, but instead can sit flat on its back side 70b when being written to. In such an embodiment, and as shown in FIG. 9, a back side alignment chamber 30a or stepper such as those discussed above (e.g., FIG. 2), can be retrofitted with a laser or lasers 52. The laser 52a will allow the back side alignment marker to be written (i.e., by laser ablation or laser-assisted etching) using the same optical path used to "see" the alignment markers once they are formed. The lasers 52 may either appear proximate to the front side 70a of the substrate (52a) or proximate to the back side 70b of the substrate 70b (52b). Through this modification, the same tool can be used both for writing the back side alignment markers and as a photolithographic stepper that uses those markers for alignment purposes. Beneficially, through this modification, a protective layer 40 over the front side 70a of the substrate need not be used when writing the back side alignment markers with the laser.

Figure 8:
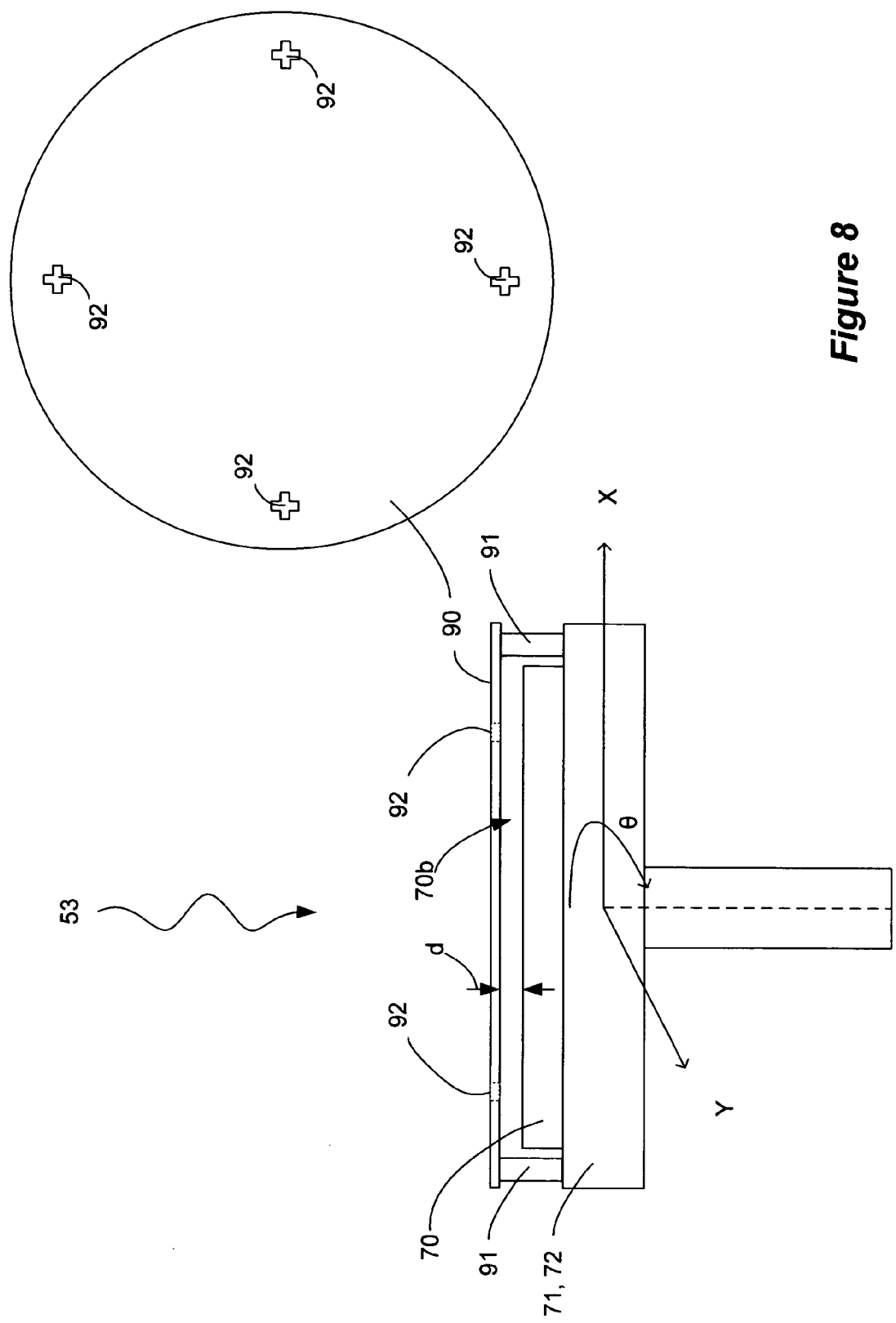
FIG. 8 illustrates a modification in which a stencil is use to mask the back side of the substrate and useful for forming the back side alignment markers with improved precision.

In an alternative embodiment, the need for the computer 56 to know the precise X, Y coordinates of the areas 75 to be removed on the back side 70b is mitigated by the use of a stencil 90, as shown in FIG. 8. According to this alternative, the stencil 90 is aligned with the substrate 70, and contains holes 92 which correspond to the desired shape of the backside alignment markers 27. The stencil 90 is raised a distance 'd' away from the surface of the substrate 70 by spacers 91, which distance might range from approximately 2 to 10 microns. Using this approach, the laser 52 can be rastered over the entire surface of the stencil 90, yet will only have effect to remove the material exposed on the back side 70b where it is exposed through the holes 92. Accordingly, once the stencil 90 is appropriately aligned with the substrate 70, using any of the techniques mentioned earlier, radiation 53 from the laser 52 can be appropriately directed to form the back side alignment markers 27 into the desired shape.

Thus, the stencil 90 ensures good alignment of the radiation 53 with the desired area 75, making laser alignment and spot size considerations less critical. (Indeed, the use of a laser in conjunction with a stencil overlying the wafer has utility to clearing materials over and above clearing the alignment markers, and can be used for patterning active circuits as well). Because the back side alignment markers are relatively large, diffractive effects occurring at the edges of the holes 92 of the stencil 90 should not cause a problem, although optical proximity corrective measures could be incorporated into the stencil 90 if necessary. If used in a laser-assisted etch application, a material should be chosen for the stencil that will not react to the etchant gases in question. For example, for a silicon etchant, quartz (silicon dioxide) would be a good choice for material for the stencil 90. Likewise, in a laser ablation application, a material should be chosen which will remain impervious to the laser radiation in question.

Although the stencil 90 is disclosed in the Figure in conjunction with chuck 72, it should be understood that the stencil 90 can also be used with the clamp assembly 79 disclosed earlier (FIGS. 6 and 7). If so used, the stencil 90 and spacers 91 would also be clamped between the top and bottom clamp arms 84 of the clamp assembly 79.

Although the disclosed laser-assisted/laser ablation techniques have been disclosed as useful in the context of forming back side alignment markers, it should be understood that the disclosed techniques can be used to form front side alignment markers, and/or to remove circuit layers from the front side.

Moreover, while particularly useful to the clearing of materials on semiconductor integrated circuit substrates, the disclosed techniques can have application to other types of substrates and other types of processes.

While it is preferred to use radiation, and specifically laser radiation, to etch the substrate to form the back side alignment markers, this is not strictly necessary. One skilled in the art will realize that other techniques for selectively removing discrete areas of materials without the use of a photoresist exist in the art, and these could be used as well. For example, an electron or other particle beam (e.g., an ion beam) could be used in much the same way as the disclosed laser radiation 53 is used to remove the substrate material by the use of a rastered beam to directly remove the material without the need for photoresist or photolithography. The use of such alternative beams can also be accompanied by the use of a stencil as disclosed herein. Again, processes for using electron or particle beams to remove materials from semiconductor integrated circuits are well known, and can be found in the Thin Film Processes book incorporated above.

"Circuit layer" as used herein can comprise any layer used in the formation of integrated circuits on the front side of the substrate, including conductive layers, semiconductive layers, or insulating layers, doped regions of the silicon, etc.

It should be understood that the inventive concepts disclosed herein are capable of many modifications. To the extent such modifications fall within the scope of the appended claims and their equivalents, they are intended to be covered by this patent.

What is claimed is:

1. A method for forming and using an alignment marker on a substrate, comprising:
    removing material on a back side of the substrate using radiation to form at least one alignment marker on the back side of the substrate;
    forming a photoresist over a front side of the substrate; and
    assessing the position of the at least one alignment marker to pattern the photoresist in alignment with the alignment marker.

2. The method of claim 1, wherein the radiation comprises radiation from a laser.

3. The method of claim 2, wherein the laser radiation removes the material by ablation.

4. The method of claim 2, wherein removing the material further comprises exposing the material to an etchant gas, and wherein the laser radiation interacts with the etchant gas to remove the material.

5. The method of claim 1, wherein assessing the position of the alignment marker comprises an optical assessment.

6. The method of claim 1, further comprising removing the patterned photoresist and etching a circuit layer underlying the patterned photoresist using non-patterned photoresist as a mask.

7. The method of claim 1, wherein, when removing material on the back side of the substrate, the front side of the substrate is unprotected.

8. The method of claim 1, wherein, when removing material on the back side of the substrate, the front side of the substrate is suspended front side down such that the substrate does not substantially come into contact with a work surface.

9. The method of claim 1, wherein patterning the photoresist comprises aligning the assessed position of the alignment marker with a mask.

10. The method of claim 1, wherein the material comprises silicon.

11. The method of claim 1, wherein removing the material comprises masking the radiation with a stencil offset from the substrate by a distance.

12. A method for forming and using an alignment marker on a substrate, comprising:

removing material on a back side of the substrate using laser radiation to form at least one alignment marker on the back side of the substrate;

forming a photoresist over a front side of the substrate; and assessing the position of the at least one alignment marker to pattern the photoresist in alignment with the alignment marker.

13. The method of claim 12, wherein the laser radiation removes the material by ablation.

14. The method of claim 12, wherein removing the material further comprises exposing the material to an etchant gas, and wherein the laser radiation interacts with the etchant gas to remove the material.

15. The method of claim 12, wherein assessing the position of the alignment marker comprises an optical assessment.

16. The method of claim 12, wherein the material is removed on the back side of the substrate without using a photoresist.

17. The method of claim 12, wherein patterning the photoresist comprises aligning the assessed position of the alignment marker with a mask.

18. The method of claim 12, wherein, when removing material on the back side of the substrate, the front side of the substrate is unprotected.

19. The method of claim 12, wherein, when removing material on the back side of the substrate, the front side of the substrate is suspended front side down such that the substrate does not substantially come into contact with a work surface.

20. The method of claim 12, wherein the material comprises silicon.

21. The method of claim 12, wherein removing the material comprises use of a stencil offset from the substrate by a distance.

22. A method for forming and using an alignment marker on a substrate, comprising:

removing material on a back side of the substrate using laser radiation to form at least one alignment marker on the back side of the substrate, wherein removing the material further comprises exposing the material to an etchant gas, and wherein the laser radiation interacts with the etchant gas to remove the material; and using the at least one alignment marker to align the substrate during formation of integrated circuitry on a front side of the substrate.

23. The method of claim 22, wherein, when removing material on the back side of the substrate, the front side of the substrate is unprotected.

24. The method of claim 22, wherein, when removing material on the back side of the substrate, the front side of the substrate is suspended front side down such that the substrate does not substantially come into contact with a work surface.

25. The method of claim 22, wherein the material comprises silicon.

26. The method of claim 22, wherein removing the material comprises masking the radiation with a stencil offset from the substrate by a distance.

27. A method for forming and using an alignment marker on a substrate, comprising:

removing material on a back side of the substrate using a laser and without using a photoresist to form at least one alignment marker on the back side of the substrate; and using the alignment marker to align the substrate during formation of integrated circuitry on a front side of the substrate.

28. The method of claim 27, wherein the laser radiation removes the material by ablation.

29. The method of claim 27, wherein removing the material further comprises exposing the material to an etchant gas, and wherein the laser radiation interacts with the etchant gas to remove the material.

30. The method of claim 27, wherein, when removing material on the back side of the substrate, the front side of the substrate is unprotected.

31. The method of claim 27, wherein, when removing material on the back side of the substrate, the front side of the substrate is suspended front side down such that the substrate does not substantially come into contact with a work surface.

32. The method of claim 27, wherein the material comprises silicon.

33. The method of claim 27, wherein removing the material comprises use of a stencil offset from the substrate by a distance.

34. A method for forming and using an alignment marker on a substrate, comprising:

removing material on a back side of the substrate using radiation to form at least one alignment marker on the back side of the substrate;

forming a photoresist over a circuit layer on a front side of the substrate;

using the at least one alignment marker to align the substrate with a mask;

patterning the photoresist using the mask;

removing the patterned photoresist to expose portions of the circuit layer; and etching the exposed portions of the circuit layer.

35. The method of claim 34, wherein the radiation comprises radiation from a laser.

36. The method of claim 35, wherein the laser radiation removes the material by ablation.

37. The method of claim 35, wherein removing the material further comprises exposing the material to an etchant gas, and wherein the laser radiation interacts with the etchant gas to remove the material.

38. The method of claim 34, wherein, when removing material on the back side of the substrate, the front side of the substrate is unprotected.

39. The method of claim 34, wherein, when removing material on the back side of the substrate, the front side of the substrate is suspended front side down such that the substrate does not substantially come into contact with a work surface.

40. The method of claim 34, wherein the material comprises silicon.

41. The method of claim 34, wherein removing the material comprises masking the radiation with a stencil offset from the substrate by a distance.

42. A method for forming and using an alignment marker on a substrate, comprising:

removing material on a back side of the substrate without using a photoresist to form at least one alignment marker on the back side of the substrate;

forming a photoresist over a circuit layer on a front side of the substrate;

using the at least one alignment marker to align the substrate with a mask;

patterning the photoresist using the mask;

removing the patterned photoresist to expose portions of the circuit layer; and etching the exposed portions of the circuit layer.

43. The method of claim 42, wherein the removing the material comprises the use of laser radiation.

44. The method of claim 43, wherein the laser radiation removes the material by ablation.

45. The method of claim 43, wherein removing the material further comprises exposing the material to an etchant gas, and wherein the laser radiation interacts with the etchant gas to remove the material.

46. The method of claim 42, wherein, when removing material on the back side of the substrate, the front side of the substrate is unprotected.

47. The method of claim 42, wherein, when removing material on the back side of the substrate, the front side of the substrate is suspended front side down such that the substrate does not substantially come into contact with a work surface.

48. The method of claim 42, wherein the material comprises silicon.

49. The method of claim 42, wherein removing the material comprises use of a stencil offset from the substrate by a distance.

50. A method for forming and using an alignment marker on a substrate, comprising:

removing material on a back side of the substrate without using a photoresist to form at least one alignment marker on the back side of the substrate;

forming a photoresist over a front side of the substrate;

assessing the position of the at least one alignment marker to pattern the photoresist in alignment with the alignment marker; and removing the patterned photoresist and etching a circuit layer underlying the patterned photoresist using non-patterned photoresist as a mask.

51. The method of claim 50, wherein the removing the material comprises the use of laser radiation.

52. The method of claim 51, wherein the laser radiation removes the material by ablation.

53. The method of claim 51, wherein removing the material further comprises exposing the material to an etchant gas, and wherein the laser radiation interacts with the etchant gas to remove the material.

54. The method of claim 50, wherein assessing the position of the alignment marker comprises an optical assessment.

55. The method of claim 50, wherein patterning the photoresist comprises aligning the assessed position of the alignment marker with a mask.

56. The method of claim 50, wherein, when removing material on the back side of the substrate, the front side of the substrate is unprotected.

57. The method of claim 50, wherein, when removing material on the back side of the substrate, the front side of the substrate is suspended front side down such that the substrate does not substantially come into contact with a work surface.

58. The method of claim 50, wherein the material comprises silicon.

59. The method of claim 50, wherein removing the material comprises use of a stencil offset from the substrate by a distance.

60. A method for forming and using an alignment marker on a substrate, comprising:

removing material on a back side of the substrate using radiation to form at least one alignment marker on the back side of the substrate, wherein, when removing material on the back side of the substrate, a front side of the substrate is unprotected; and using the at least one alignment marker to align the substrate during formation of integrated circuitry on the front side of the substrate.

61. The method of claim 60, wherein the radiation comprises radiation from a laser.

62. The method of claim 61, wherein the laser radiation removes the material by ablation.

63. The method of claim 61, wherein removing the material further comprises exposing the material to an etchant gas, and wherein the laser radiation interacts with the etchant gas to remove the material.

64. The method of claim 60, wherein, when removing material on the back side of the substrate, the front side of the substrate is suspended front side down such that the substrate does not substantially come into contact with a work surface.

65. A method for forming and using an alignment marker on a substrate, comprising:

removing material on a back side of the substrate using radiation to form at least one alignment marker on the back side of the substrate, wherein, when removing material on the back side of the substrate, a front side of the substrate is suspended front side down such that the substrate does not substantially come into contact with a work surface; and using the at least one alignment marker to align the substrate during formation of integrated circuitry on the front side of the substrate.

66. The method of claim 65, wherein the radiation comprises radiation from a laser.

67. The method of claim 66, wherein the laser radiation removes the material by ablation.

68. The method of claim 66, wherein removing the material further comprises exposing the material to an etchant gas, and wherein the laser radiation interacts with the etchant gas to remove the material.

69. A method for forming and using an alignment marker on a substrate, comprising:

removing material on a back side of the substrate using radiation to form at least one alignment marker on the back side of the substrate, wherein removing the material comprises masking the radiation with a stencil offset from the substrate by a distance; and using the at least one alignment marker to align the substrate during formation of integrated circuitry on a front side of the substrate.

* * * * *